United States Patent
Imai (10) Patent No.: US 9,129,939 B2
(45) Date of Patent: Sep. 8, 2015

(54) SIC SEMICONDUCTOR DEVICE AND METHOD FOR MANUFACTURING THE SAME

(71) Applicant: FUJI ELECTRIC CO., LTD., Kawasaki-shi (JP)

(72) Inventor: Fumikazu Imai, Kawasaki (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/078,833

(22) Filed: Nov. 13, 2013

(65) Prior Publication Data

US 2014/0061674 A1 Mar. 6, 2014

Related U.S. Application Data

(63) Continuation of application No. PCT/JP2012/064003, filed on May 30, 2012.

(30) Foreign Application Priority Data

May 30, 2011 (JP) ................. 2011-120124

(51) Int. Cl.

| | |
|---|---|
| H01L 21/00 | (2006.01) |
| H01L 31/0312 | (2006.01) |
| H01L 29/45 | (2006.01) |
| H01L 21/04 | (2006.01) |
| H01L 21/283 | (2006.01) |
| H01L 29/66 | (2006.01) |
| H01L 29/872 | (2006.01) |
| H01L 29/06 | (2006.01) |
| H01L 29/16 | (2006.01) |

(52) U.S. Cl.
CPC .......... *H01L 29/456* (2013.01); *H01L 21/0485* (2013.01); *H01L 21/283* (2013.01); *H01L 29/0619* (2013.01); *H01L 29/45* (2013.01); *H01L 29/6606* (2013.01); *H01L 29/872* (2013.01); *H01L 29/1608* (2013.01)

(58) Field of Classification Search
CPC ..................................... H01L 29/456
USPC ........... 257/77, 757, 770, E21.438–E21.439; 438/105, 683

See application file for complete search history.

(56) References Cited

U.S. PATENT DOCUMENTS

| | | |
|---|---|---|
| 2006/0273323 A1 | 12/2006 | Yamamoto et al. |
| 2007/0138482 A1 | 6/2007 | Tanimoto |
| 2010/0207125 A1 | 8/2010 | Uchida et al. |

FOREIGN PATENT DOCUMENTS

| | | |
|---|---|---|
| JP | 2000-208438 A | 7/2000 |
| JP | 2003-243323 A | 8/2003 |
| JP | 2006-344688 A | 12/2006 |

(Continued)

*Primary Examiner* — Calvin Lee
(74) *Attorney, Agent, or Firm* — Rossi, Kimms & McDowell LLP (57) ABSTRACT

In some aspects of the invention, a layer containing titanium and nickel is formed on an SiC substrate. A nickel silicide layer containing titanium carbide can be formed by heating. A carbon layer precipitated is removed by reverse sputtering. Thus, separation of an electrode of a metal layer formed on nickel silicide in a subsequent step is suppressed. The effect of preventing the separation can be further improved when the relation between the amount of precipitated carbon and the amount of carbon in titanium carbide in the surface of nickel silicide from which the carbon layer has not yet been removed satisfies a predetermined condition.

7 Claims, 4 Drawing Sheets

(56) References Cited

FOREIGN PATENT DOCUMENTS

| | | |
|---|---|---|
| JP | 2007-184571 A | 7/2007 |
| JP | 2008-053291 A | 3/2008 |
| JP | 2010-062524 A | 3/2010 |
| JP | 2010-086999 A | 4/2010 |
| JP | 2012248729 * | 5/2011 ............. H01L 21/28 |
| WO | 2009/054140 A1 | 4/2009 |

* cited by examiner

SIC SEMICONDUCTOR DEVICE AND METHOD FOR MANUFACTURING THE SAME

CROSS-REFERENCE TO RELATED APPLICATIONS

This application is a continuation of International Application No. PCT/JP2012/064003, filed on May 30, 2012, which is based on and claims priority to Japanese Patent Application No. JP 2011-120124, filed on May 30, 2011. The disclosure of the Japanese priority application and the PCT application in their entirety including the drawings, claims, and the specification thereof, are incorporated herein by reference.

BACKGROUND OF THE INVENTION

1. Field of the Invention

Embodiments of the invention relate to semiconductor devices in which separation of an electrode is prevented.

2. Related Art

Among semiconductor devices heretofore used as power devices, some semiconductor devices using silicon as their semiconductor materials are the mainstream. Silicon carbide (SiC) that is a wide-gap semiconductor has physical properties including thermal conductivity three times as high, maximum electric field intensity ten times as high and electron drift velocity twice as high as silicon. For this reason, in recent years, applications of SiC as power devices which can operate with high breakdown voltage and low loss at a high temperature have been researched.

As for the structure of a power device, a vertical semiconductor device with a back-side electrode provided with a low-resistance ohmic electrode on the back side is the mainstream. Various materials and structures have been used for the back-side electrode. As one of those, there has been proposed a laminate of a titanium layer, a nickel layer and a silver layer (see, for example, Japanese patent application no. JP-A-2007-184571 (also referred to herein as "PTL 1")), a laminate of a titanium layer, a nickel layer and a gold layer (see, for example, Japanese patent application no. JP-A-2010-86999 (also referred to herein as "PTL 2")), or the like.

In a vertical semiconductor device using SiC as typified by a Schottky barrier diode, used is a method in which a nickel silicide layer is formed by heating after an SiC substrate is filmed with a nickel layer, and an ohmic contact is formed between the SiC substrate and the nickel silicide layer (for example, see the following PTL 1 and the following PTL 2). However, there is a problem that, when a back-side electrode is formed on the nickel silicide layer, the back-side electrode is separated from the nickel silicide layer easily.

Therefore, there has been proposed a technique of a back-side electrode in which a titanium layer, a nickel layer and a silver layer are laminated in this order after a nickel layer remaining on the surface of a nickel silicide layer when the nickel silicide layer is formed is eliminated from the surface of the nickel silicide layer (see, for example, Japanese patent application no. JP-A-2008-53291 (also referred to herein as "PTL 3")). It has been suggested that a portion of a cathode electrode in contact with the nickel silicide layer is made of another metal than nickel so as to suppress a defect of separation. It has been also suggested that even if a layer where carbon has been precipitated is formed between the nickel silicide or the like and the cathode electrode, the layer where carbon has been precipitated can be removed together with the nickel layer so that separation can be prevented.

In addition, there has been proposed a technique in which carbide formed in the surface of a nickel silicide layer is removed to improve the adhesion of a back-side electrode (see, for example, Japanese patent application no. JP-A-2003-243323 (also referred to herein as "PTL 4")).

In PTL 3 or PTL 4 belonging to the background art, there is a problem that the adhesion between a nickel silicide layer and a titanium layer of a cathode electrode layer is low even in a back-side electrode with a configuration conceived to be capable of suppressing a defect. For example, there is a problem that the back-side electrode may be separated from the nickel silicide layer when a semiconductor device is diced.

For example, in a method for manufacturing a back-side electrode for an SiC semiconductor device as described in PTL 3, a nickel layer is formed on an SiC substrate, a nickel silicide layer is formed by subsequent heating, and an ohmic contact is formed between the SiC and the nickel silicide layer.

According to the description of PTL 1, nickel silicide is produced by solid-phase reaction expressed by the following reaction formula.

$$Ni + 2SiC \rightarrow NiSi_2 + 2C$$

Carbon (C) produced in the aforementioned reaction formula exists as an unstable supersaturation state or a micro-precipitate so as to be dispersed all over the inside of the nickel silicide layer. Once heating treatment is performed after silicide is formed, the C is discharged at once, and aggregated (precipitated) stratiformly as a precipitate regarded as graphite on and inside the silicide layer. The precipitate is a material which is fragile and poor in adherability. Accordingly, the precipitate is broken easily when slight stress acts thereon. Thus, a back-side electrode metal layer formed on the silicide layer is separated.

As described above, in the process for manufacturing an SiC semiconductor device, after Ni for forming an ohmic electrode is deposited on an SiC substrate, the SiC substrate and the Ni of the electrode react with each other due to heating treatment so that nickel silicide is formed. Further, due to various heating treatments carried out in a step of forming a Schottky electrode of the semiconductor device, and so on, there is a problem that carbon in the SiC substrate is diffused and precipitated in the nickel silicide or on the surface of the nickel silicide.

SUMMARY OF INVENTION

To solve these problems, an object of the invention is to provide a method for manufacturing an SiC semiconductor device capable of satisfactorily suppressing separation of a back-side electrode, and an SiC semiconductor device having a back-side electrode structure capable of preventing separation of a back-side electrode.

According to the invention, in order to form an electrode on a substrate of an SiC semiconductor, a method in which a layer containing titanium and nickel is formed and a nickel silicide layer containing titanium carbide is formed by heating is substituted for a background-art method in which an Ni layer is formed. The nickel silicide layer containing titanium carbide can be formed by heating after the layer containing titanium and nickel is, for example, made of a nickel layer and a titanium layer laminated sequentially on the SiC substrate. Due to the produced titanium carbide, precipitation of carbon can be prevented.

Further, a carbon layer precipitated on the nickel silicide layer containing titanium carbide is removed by reverse sputtering so that separation of a metal layer formed on the nickel silicide in a subsequent step can be suppressed.

According to the invention, a carbon layer precipitated in the surface due to various treatment steps (for forming a Schottky electrode, etc.) performed after the formation of the nickel silicide layer containing titanium carbide is removed before formation of a back-side electrode metal film so that separation of the back-side electrode can be prevented.

The effect of preventing the separation can be further improved when the relation between the quantity of precipitated carbon and the quantity of carbon in titanium carbide in the nickel silicide surface from which the carbon layer has not yet been removed satisfies a predetermined condition.

According to the invention, a titanium layer is disposed on the side of the nickel silicide layer containing titanium carbide and in contact therewith, as a metal layer formed on the nickel silicide layer containing titanium carbide. A nickel layer and a gold layer are laminated sequentially on the titanium layer so that a back-side electrode is formed. The nickel silicide layer is referred to as an ohmic electrode, and the metal layer in which the titanium layer, the nickel layer and the gold layer are laminated in this order is referred to as a back-side electrode. The structure constituted by the ohmic electrode and the back-side electrode is referred to as a back-side electrode structure. On the other hand, on an opposite surface of the SiC substrate to the back-side electrode structure, a Schottky electrode is formed in contact with the SiC substrate and a surface electrode made of a metal layer is formed on the Schottky electrode. The structure constituted by the Schottky electrode and the surface electrode is referred to as a surface electrode structure.

The layer containing the titanium carbide layer produced by heating the layer containing nickel and titanium is superior in adhesion to the nickel silicide layer and in adhesion to the titanium layer used in the back-side electrode.

In order to attain the foregoing object, the invention has the following characteristics.

According to the invention, a method for manufacturing a semiconductor device in which an electrode structure is formed in an SiC semiconductor is characterized by including: producing a nickel silicide layer containing titanium carbide by heating after a layer containing nickel and titanium is formed on the SiC semiconductor; removing a carbon layer produced in a surface of the nickel silicide layer by reverse sputtering; and forming a metal layer by laminating a titanium layer, a nickel layer and a gold layer sequentially on the nickel silicide layer containing titanium carbide.

Preferably, the carbon layer produced in the surface of the nickel silicide layer containing titanium carbide is arranged so that the ratio of the number of carbon atoms contained in titanium carbide in the topmost surface to the total number of carbon atoms in the topmost surface is not lower than 12%. Here, the topmost surface corresponds to a portion up to a surface depth to be analyzed when the surface is analyzed by AES (Auger Electron Spectroscopy), XPS (X-ray Photoelectron Spectroscopy) or the like. The depth of the topmost surface is several nm. Specifically, the depth of the topmost surface is 2 to 3 nm. Averaged information about a depth up to several μm is obtained by another surface analysis manner such as EPMA. In order to clarify a difference from those, the surface depth herein is expressed by "topmost surface" or "top surface". The "total number of carbon atoms in the topmost surface" includes the number of carbon atoms in the carbon layer precipitated in the surface, the number of carbon atoms included in titanium carbide in the topmost surface, and the number of unreacted carbon atoms remaining in the nickel silicide layer in the topmost surface. Preferably the ratio of the number of carbon atoms included in titanium carbide in the topmost surface to the total number of carbon atoms in the topmost surface is not lower than 12%. When the ratio is not lower than 12%, the metal layer of the electrode can be prevented from being separated therefrom, and the effect of suppressing the separation is conspicuous. The upper limit of the ratio may be selected suitably. It has been proved that the effect of preventing the separation is secured at 30%, and the effect of preventing the separation is satisfied at 20%. Thus, the ratio is not lower than 12% and not higher than 30%, preferably not lower than 12% and not higher than 20%.

In the invention, it is preferable that the layer containing nickel and titanium is formed by sequential lamination of a nickel layer and a titanium layer on the surface of the SiC semiconductor.

The carbon layer produced in the surface of the nickel silicide layer is made of carbon atoms precipitated in several atomic layers or locally on the surface of the nickel silicide layer. The carbon atoms are precipitated in one to nine layers, preferably one to three layers, and often precipitated locally on the surface of the nickel silicide layer. The carbon atoms are precipitated locally and like islands. For example, the carbon atoms are precipitated like islands or domain structures each having an area not larger than 1 $\mu m^2$.

The SiC semiconductor device according to the invention has a back-side electrode structure, which includes an ohmic electrode of the nickel silicide layer containing titanium carbide and a back-side electrode of the metal layer, as a specific structure of the electrode structure, and a Schottky electrode and a surface electrode as a surface electrode structure.

It is preferable that argon reverse sputtering is used as the reverse sputtering in the invention. On that occasion, the preferable value of pressure of argon gas is not lower than 0.1 Pa and not higher than 1 Pa, and RF power is not lower than 100 W and not higher than 600 W. When the pressure is out of the upper or lower limit value or the power is out of the lower limit value, stable discharge of reverse sputtering is difficult. On the other hand, when the power exceeds the upper limit value, damage to the device is large.

An SiC semiconductor device according to the invention is characterized by being manufactured in a method for manufacturing an SiC semiconductor device according to the invention. In addition, an SiC semiconductor device according to the invention is characterized by including an electrode structure in which a nickel silicide layer containing titanium carbide, a titanium layer, a nickel layer and a gold layer are laminated sequentially on an SiC semiconductor. In addition, it is preferable that in the nickel silicide layer containing titanium carbide, a nickel silicide layer and a titanium carbide layer are laminated sequentially in order of increasing distance from the SiC semiconductor.

According to the method for manufacturing a silicon carbide semiconductor device according to the invention, it is possible to satisfactorily suppress separation of an electrode. Since the separation of the electrode is suppressed, the separation during dicing is suppressed so that the yield can be improved and the production efficiency can be increased. In the method for manufacturing a silicon carbide semiconductor device according to the invention, a nickel silicide layer containing titanium carbide is produced by heating after a layer containing nickel and titanium is formed on the silicon carbide semiconductor, and a carbon layer produced in the surface of the nickel silicide layer is removed by reverse sputtering. Thus, separation of an electrode of a metal layer formed later can be suppressed so that the yield against the separation during dicing can be improved. In addition, a titanium layer, a nickel layer and a gold layer are laminated sequentially on the nickel silicide layer containing titanium carbide, so as to enhance the adhesion between the nickel silicide layer containing titanium carbide and the titanium layer. Thus, the separation can be more prevented.

According to the invention, there is a conspicuous effect that no separation occurs between the surface of the nickel silicide layer and the metal layer of the electrode when the carbon layer produced in the surface of the nickel silicide layer containing titanium carbide is arranged so that the ratio of the number of carbon atoms included in titanium carbide in the topmost surface to the total number of carbon atoms in the topmost surface is not lower than 12%.

According to the silicon carbide semiconductor device of the invention, the separation of the electrode is suppressed. When the invention is applied to a Schottky barrier diode, it is possible to reduce on-resistance while suppressing the leak of the Schottky barrier diode with a withstanding voltage of 1,000 V or higher. As a result, it is possible to reduce the chip area and reduce the product unit price. In addition, it is possible to manufacture a diode having a large rating, which can be applied to an inverter for an industrial electric motor, a Shinkansen train car, etc. needing a large current. It is therefore possible to contribute to high efficiency and miniaturization of an apparatus.

DETAILED DESCRIPTION

An embodiment of the invention will be described below. A Schottky barrier diode will be described with reference to FIGS. 1 to 8, as a preferred embodiment of an SiC semiconductor device according to the invention. FIGS. 1 to 8 are views for explaining a method for manufacturing a Schottky barrier diode. FIGS. 1 to 8 schematically show a section of the Schottky barrier diode during manufacturing steps. FIG. 8 shows a structure of the manufactured Schottky barrier diode. The Schottky barrier diode using an SiC semiconductor is provided with an SiC substrate 1, a guard ring 2, an insulating layer 3, a nickel silicide layer 4 containing titanium carbide, a carbon layer 5, a Schottky electrode 6, a surface electrode 7 and a back-side electrode 8.

Figure 1:
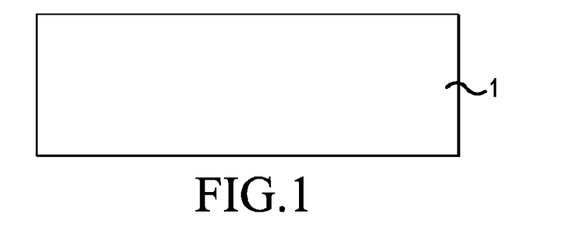
FIG. 1 is a sectional view showing an SiC substrate in manufacturing of a Schottky barrier diode according to an embodiment of the invention.

FIG. 1 is a sectional view showing the SiC substrate 1. The SiC substrate 1 is arranged by lamination of an epitaxial layer made of SiC on a wafer layer made of SiC. In FIG. 1, the wafer layer and the epitaxial layer are expressed by one and the same sign.

Figure 2:
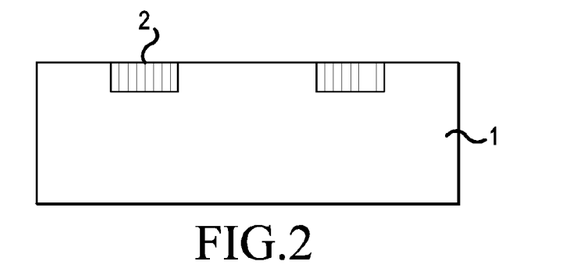
FIG. 2 is a sectional view showing a step of forming a guard ring in the manufacturing of the Schottky barrier diode according to the embodiment of the invention.

FIG. 2 is a view showing a step of forming the guard ring 2. Ions are injected into a part of the epitaxial layer on the surface side of the SiC substrate 1 so as to form the guard ring 2.

Figure 3:
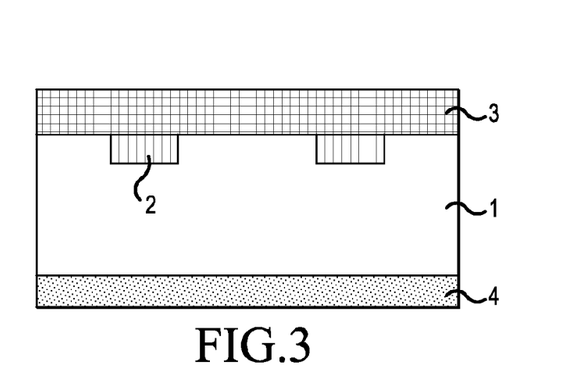
FIG. 3 is a sectional view showing a step of forming an insulating layer and a nickel silicide layer in the manufacturing of the Schottky barrier diode according to the embodiment of the invention.

FIG. 3 is a sectional view showing a step of forming the insulating layer 3 and the nickel silicide layer 4. After the insulating layer 3 made of $SiO_2$ is formed on the guard ring 2, the back side of the SiC substrate 1 is filmed with a layer containing nickel (Ni) and titanium (Ti). By subsequent heating, the nickel silicide layer 4 containing titanium carbide is formed. For the layer containing nickel and titanium, a nickel layer and a titanium layer are preferably formed in order of increasing distance from the back side of the SiC substrate 1. The nickel layer and the titanium layer can be formed by lamination when the ratio of film thickness between nickel and titanium is set in a range of from 1:1 to 10:1, preferably from in a range of from 3:1 to 6:1. On that occasion, it is preferable that the film thickness of nickel is 20 to 100 nm, and the film thickness of titanium is 10 to 50 nm. In addition, the layer may be formed as an alloy containing titanium in nickel. The layer can be formed when the ratio between nickel and titanium is set in a range of from 1:1 to 10:1, preferably in a range of from 3:1 to 6:1.

A thin-film formation method such as vapor deposition or sputtering may be used as the method for forming the nickel layer and the titanium layer. After the thin films are formed, the thin films are heated at 1,000 to 1,200° C. in an argon atmosphere, so as to obtain the nickel silicide layer 4.

The thus formed nickel silicide layer 4 containing titanium carbide is 10 to 100 nm thick, preferably 20 to 30 nm thick.

Titanium carbide exhibits good adhesion to titanium of the laminate constituting the back-side electrode so that titanium carbide has a function of suppressing separation of the back-side electrode. In addition, in the nickel silicide layer 4 containing titanium carbide, it is more preferable that the ratio of the number of carbon atoms included in titanium carbide in the topmost surface to the total number of carbon atoms precipitated in the topmost surface is not lower than 12%, so as to prevent separation of the electrode therefrom. Incidentally, even if the ratio is lower than 12%, the separation can be suppressed to obtain an effect to improve the yield.

Figure 4:
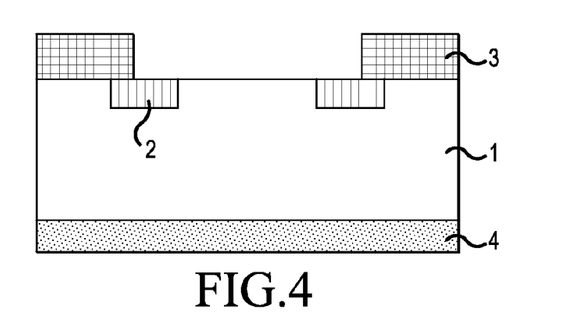
FIG. 4 is a sectional view showing a step of forming a contact hole in the manufacturing of the Schottky barrier diode according to the embodiment of the invention.

FIG. 4 is a sectional view showing a step of forming a contact hole. As shown in FIG. 4, a part of the insulating layer 3 is removed by etching, so as to form a contact hole.

Figure 5:
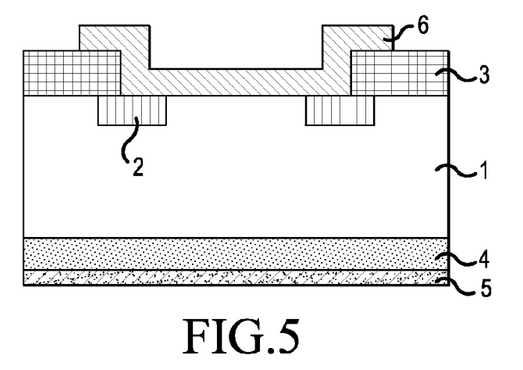
FIG. 5 is a sectional view showing a step of forming a Schottky electrode in the manufacturing of the Schottky barrier diode according to the embodiment of the invention.

FIG. 5 is a sectional view showing a step of forming the Schottky electrode 6. For example, a film of titanium is formed as a Schottky electrode in the portion of the SiC substrate 1 exposed by etching, and a Schottky contact is formed by subsequent heating. The heating temperature is about 400 to 600° C. The heating atmosphere is of argon or helium. On this occasion, a part of carbon contained inside the nickel silicide layer is precipitated on the surface of the nickel silicide layer containing titanium carbide, so that the carbon layer 5 is formed, as shown in FIG. 5. The carbon layer 5 is precipitated in several atomic layers and locally.

Figure 6:
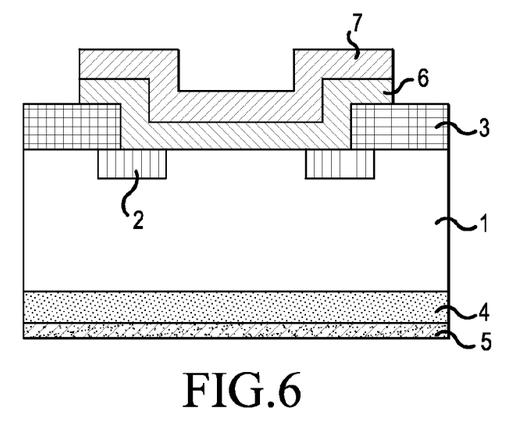
FIG. 6 is a sectional view showing a step of forming a surface electrode in the manufacturing of the Schottky barrier diode according to the embodiment of the invention.

FIG. 6 is a sectional view showing a step of forming the surface electrode 7. As shown in FIG. 6, the Schottky electrode 6 is, for example, covered with aluminum, which serves as the surface electrode 7.

Figure 7:
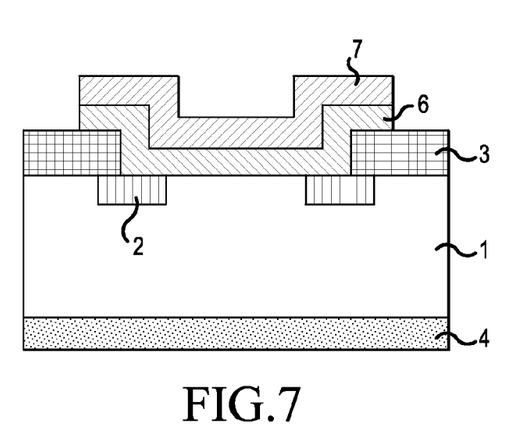
FIG. 7 is a sectional view showing a step of removing a carbon layer formed on nickel silicide in the manufacturing of the Schottky barrier diode according to the embodiment of the invention.
Figure 8:
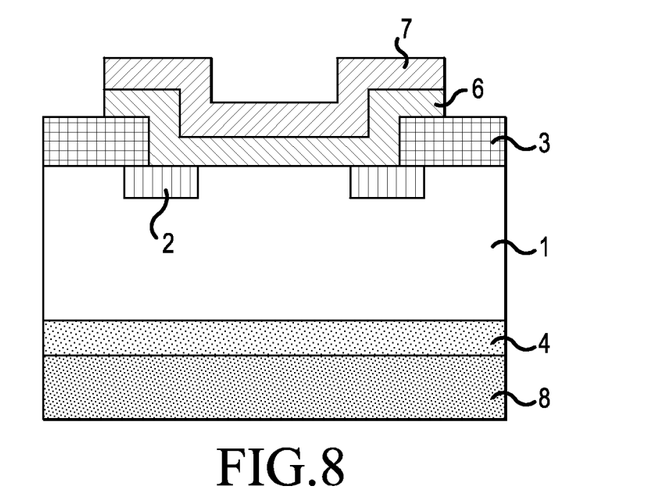
FIG. 8 is a sectional view showing a step of forming a back-side electrode in the manufacturing of the Schottky barrier diode according to the embodiment of the invention.

FIG. 7 is a sectional view showing a step of removing the carbon layer 5 formed on the nickel silicide layer 4 containing titanium carbide. As shown in FIG. 7, reverse sputtering is applied to remove the carbon layer 5 formed on the surface of the nickel silicide layer 4. It is preferable that the reverse sputtering is carried out in argon pressure not lower than 0.1 Pa and not higher than 1 Pa, and with RF power not lower than 100 W and not higher than 300 W.

FIG. 8 is a sectional view showing a step of forming a laminate of metal layers so as to serve as the back-side electrode 8. The back-side electrode 8 composed of a laminate in which titanium, nickel and gold are laminated in this order is formed on the nickel silicide layer 4 containing titanium carbide, from which the carbon layer 5 has been removed.

After that, the substrate on which all the film formation operations have been completed is diced. Thus, a chip of an SiC Schottky barrier diode can be obtained.

Description has been made about the Schottky barrier diode. However, the SiC semiconductor device according to the invention is not limited to the Schottky barrier diode, but may be applied to various semiconductor devices using SiC, such as MOSFETs, in the same manner.

EXAMPLE 1

Figure 9:
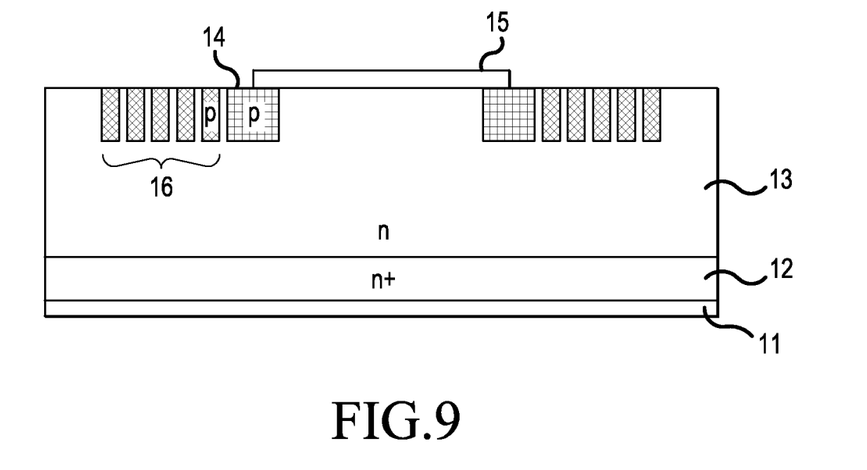
FIG. 9 is a view showing an example of the Schottky barrier diode according to the embodiment of the invention.

FIG. 9 is a view for explaining a Schottky barrier diode (FLR-SBD) having a field limiting ring structure, which is manufactured in this Example. This FLR-SBD is also manufactured in the same procedure as described above in FIGS. 1 to 9.

First, by ion injection, an n-type region for a channel stopper, a p-type region (p-type impurity ion injection region) 14 for a termination structure and a p-type region for an FLR structure 16 were formed on an SiC substrate (high-concentration n-type substrate) 12 where an epitaxial layer (low-concentration n-type drift layer) 13 was formed.

After that, in order to activate phosphorous injected for forming the n-type region for the channel stopper and aluminum injected for forming the p-type region 14 for the termination structure and the p-type region for the FLR structure 16, activation was performed at 1,620° C. in an argon atmosphere for 180 seconds. After that, an SiO$_2$ film 500 nm thick was formed on the surface side of the substrate by use of an atmospheric pressure CVD (Chemical Vapor Deposition) apparatus.

On the other hand, a nickel layer 60 nm thick and a titanium layer 20 nm thick were laminated on the back side of the SiC substrate 12 in this order by use of a sputtering apparatus so as to film the back side of the substrate. Heating treatment at 1,050° C. in an argon atmosphere for two minutes was applied to the filmed SiC substrate 12 using a rapid thermal annealing apparatus (RTA) provided with an infrared lamp. Due to the heating treatment, silicon atoms in the SiC substrate 12 reacted with nickel to produce nickel silicide so that an ohmic contact could be obtained. In addition, carbon atoms in the SiC substrate 12 reacted with titanium to produce titanium carbide, which was precipitated on the surface of nickel silicide. On that occasion, unreacted carbon atoms remained in the nickel silicide layer. The ratio of the number of carbon atoms contained in titanium carbide in the topmost surface of the nickel silicide layer to the total number of carbon atoms precipitated on the surface was not lower than 12%. Here, the number of carbon atoms was calculated by XPS analysis. The calculation was based on the ratio between the total value of a plurality of C1s peak intensities appearing due to chemical shift and the peak intensity derived from TiC in the C1s peaks observed near 283 eV.

A contact hole was formed in the oxide film on the surface side of the SiC substrate 12 by use of a hydrofluoric buffer solution (see FIG. 4), and a film of titanium for a Schottky electrode 15 was formed to be 200 nm thick by a sputtering apparatus. After that, treatment at 500 C in an argon atmosphere for 5 minutes was carried out using a rapid thermal annealing apparatus (RTA) provided with an infrared lamp (see FIG. 5). On this occasion, C in the nickel silicide layer was precipitated so that a thin carbon layer was formed. After that, a film of aluminum for a surface electrode was formed to be 5000 nm thick rapidly using the sputtering apparatus (see FIG. 6). After the film of the surface electrode was formed, the SiC substrate 12 was reversed, and argon reverse sputtering was carried out in pressure of 0.5 Pa and with RF power of 300 W for 3 minutes, so as to remove the carbon layer formed on the surface of the nickel silicide layer (see FIG. 7). Next, titanium 70 nm thick, nickel 700 nm thick and gold 200 nm were deposited continuously on the nickel silicide layer using a vapor deposition apparatus, so as to form a back-side electrode (ohmic electrode) 11 of a metal laminate (see FIG. 8).

The SiC substrate 12 in which the aforementioned electrode structure was formed was diced. As a result, it was possible to obtain an SiC Schottky barrier diode in which the back-side electrode 11 was not separated at all but on-voltage (Vf) at room temperature was 1.7 V.

COMPARATIVE EXAMPLE 1

Next, a process for manufacturing an SiC semiconductor device in Comparative Example 1 will be described. In the aforementioned Example 1, an Ni layer on which a Ti layer was formed was heated to obtain nickel silicide containing titanium carbide when a back-side electrode was formed. On the other hand, comparative Example 1 is an example in which an Ni layer was heated without a Ti layer formed thereon. By ion injection, an n-type region for a channel stopper, a p-type region for a termination structure and a p-type region for a floating limiting ring (FLR) structure were formed on an SiC substrate where an epitaxial layer was formed. After that, in order to activate phosphorous injected for forming the n-type region for the channel stopper and aluminum injected for forming the p-type region for the termination structure and the p-type region for the FLR structure, activation was performed at 1,620° C. in an argon atmosphere for 180 seconds.

Then, an SiO$_2$ film was formed to be 500 nm thick on the surface side of the substrate by use of an atmospheric pressure CVD apparatus. After that, the back side of the substrate was filmed with a nickel layer 60 nm thick by use of a sputtering apparatus. After that, heating treatment at 1,050° C. in an argon atmosphere for two minutes was applied to the filmed SiC substrate in the same manner as in Example 1, that is, using a rapid thermal annealing apparatus (RTA) provided with an infrared lamp. Due to the heating treatment, silicon atoms in the SiC substrate reacted with nickel so that nickel silicide was produced. After the silicide layer was formed, a film of a surface electrode was formed in the same process as in Example 1. After that, the substrate was reversed, and argon reverse sputtering was carried out in pressure of 0.5 Pa and with RF power of 300 W for 3 minutes. Then, a carbon layer formed on the surface of the nickel silicide layer was removed. After that metal layers similar to those in Example 1, that is, a Ti layer, an Ni layer and an Au layer were laminated on the nickel silicide layer in order of increasing distance from the substrate, so that the laminate of these metal layers was formed as a back-side electrode. The SiC substrate obtained thus was diced. As a result, the back-side electrode was separated in an interface between the nickel silicide layer and the titanium layer in the back-side electrode.

COMPARATIVE EXAMPLE 2

In Comparative Example 2, the same method as in Example 1 was used till a film of aluminum for a surface electrode was formed. After that, a back-side electrode was formed without being subjected to reverse sputtering. An SiC substrate obtained thus was diced. As a result, the back-side electrode was separated in an interface between a nickel silicide layer and a titanium layer in the back-side electrode.

EXAMPLE 2

Different cases in terms of the ratio of the number of carbon atoms contained in titanium carbide in the topmost surface of a nickel silicide layer to the total number of carbon atoms precipitated in the topmost surface were examined. Each SiC Schottky barrier diode was manufactured as follows in the same manner as in Example 1, except that the thickness of a titanium layer for producing the nickel silicide layer containing titanium carbide was varied.

By ion injection, an n-type region for a channel stopper, a p-type region for a termination structure and a p-type region for a floating limiting ring (FLR) structure were formed on an SiC substrate where an epitaxial layer was formed. After that, in order to activate phosphorous injected for forming the n-type region for the channel stopper and aluminum injected for forming the p-type region for the termination structure and the p-type region for the FLR structure, activation was performed at 1,620° C. in an argon atmosphere for 180 seconds. Then, an $SiO_2$ film was formed to be 500 nm thick on the surface side of the substrate by use of an atmospheric pressure CVD apparatus. After that, the back side of the substrate was filmed with titanium layer A nm thick and a nickel layer 60 nm thick by use of a sputtering apparatus, and heating treatment at 1,050° C. in an argon atmosphere for two minutes was applied to the filmed substrate by use of an RTA apparatus so that titanium carbide and nickel silicide were produced.

A plurality of Ti and Ni layers different in film thickness were formed and heated so that nickel silicide layers containing titanium carbide different in the ratio between Ti and Ni could be formed. Specifically, the amount of produced titanium carbide was varied by varying the sputtering thickness A of the titanium layer from 0 to 40 nm when the nickel silicide layer was produced. Thus, the adhesion of each back-side electrode was evaluated.

Figure 10:
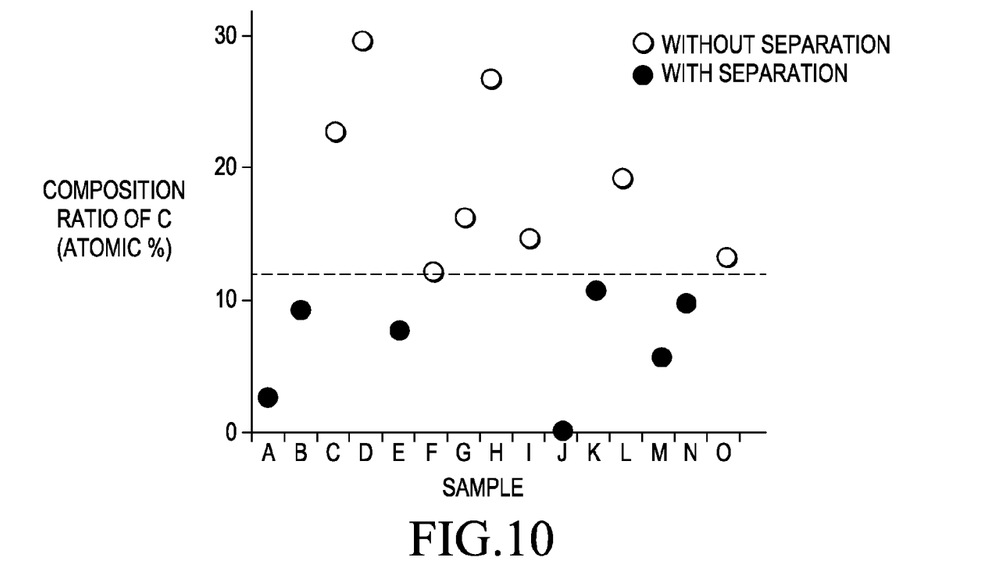
FIG. 10 is a graph showing that the back-side electrode is not separated when the concentration of carbon atoms derived from TiC according to the invention is not lower than 12%.

FIG. 10 is a graph showing the relation between the concentration of carbon atoms derived from TiC and the existence of separation. In FIG. 10, the ordinate designates the composition ratio (atomic %) of carbon C, and the abscissa designates each sample A to O. White circles designate absence of separation, and black circles designate existence of separation. From FIG. 10, it is proved that there is a correlation in which the back-side electrode is not separated when the concentration of carbon atoms derived from TiC is not lower than 12%.

For example, in the case where film formation was made so that the thickness A of the titanium layer was 10 nm and the thickness of the nickel layer was 60 nm, the number of carbon atoms contained in titanium carbide in the topmost surface was 6% to the total number of carbon atoms precipitated in the surface. After that, a back-side electrode was formed in the same manner as in Example 1. A substrate obtained thus was diced. As a result, the back-side electrode was separated in an interface between the nickel silicide layer and the titanium layer.

There are cases where separation occurred when the ratio was lower than 12%. However, the rate of the separation was reduced in comparison with Comparative Example 1 and Comparative Example 2 so that the yield was improved.

EXAMPLE 3

Figure 11:
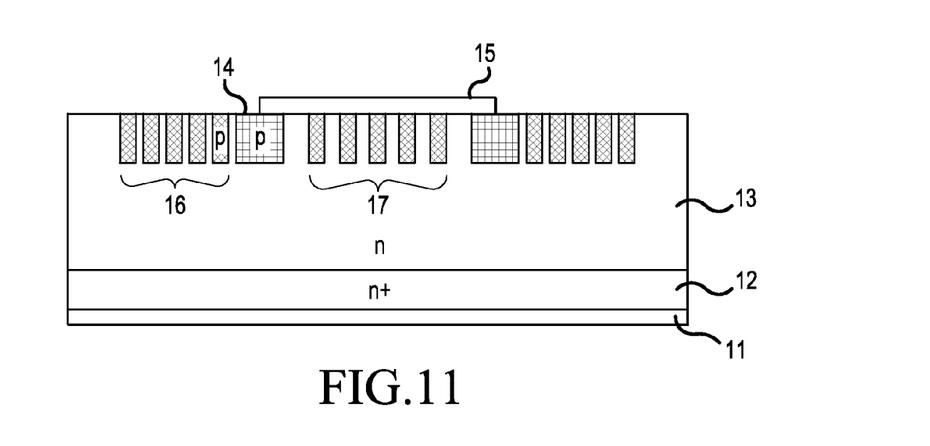
FIG. 11 is a view showing another example of the Schottky barrier diode according to the embodiment of the invention.

FIG. 11 is a view showing another example of the Schottky barrier diode according to the embodiment of the invention. In place of the Schottky barrier diode depicted and described in Example 1, a Schottky barrier diode (SBD) with a junction barrier Schottky (JBS) structure 17 shown in FIG. 11 may be manufactured in the same manner as in Example 1. A nickel layer 60 nm thick and a titanium layer 20 nm thick were formed and laminated sequentially in order of increasing distance from the SiC substrate 12, and a nickel silicide layer containing titanium carbide was produced by heating treatment. After that, carbon atoms precipitated during the subsequent manufacturing steps were removed by reverse sputtering. After the back-side electrode 11 was formed, the SiC substrate 12 was diced. As a result, no separation occurred in the back-side electrode 11.

As apparent from the results of the examples and the comparative examples which have been described above, separation of a back-side electrode can be suppressed satisfactorily in an SiC semiconductor device according to the invention, and the SiC semiconductor device is superior in reliability.

The aforementioned embodiment and examples have been described in order to facilitate understanding of the invention. The invention is not limited to those forms.

The Schottky barrier diode according to the invention can be used as a Schottky barrier diode with a high withstanding voltage of 1,000 V or higher, and on-resistance can be reduced while leak is suppressed. Thus, the invention is useful in reducing the chip area and reducing the product unit price. In addition, it is possible to manufacture a diode having a large rating, which can be applied to an inverter for an industrial electric motor, a Shinkansen train car, etc. needing a large current. It is therefore possible to contribute to high efficiency and miniaturization of an apparatus.

What is claimed is:

1. A method for manufacturing an SiC semiconductor device in which an electrode structure is formed in an SiC semiconductor, the method comprising:
    producing a nickel silicide layer containing titanium carbide by heating after a layer containing nickel and titanium is formed on the SiC semiconductor;
    removing a carbon layer produced in a surface of the nickel silicide layer by reverse sputtering; and
    forming a metal layer by laminating a titanium layer, a nickel layer and a gold layer sequentially on the nickel silicide layer containing titanium carbide.

2. A method for manufacturing an SiC semiconductor device according to claim 1, wherein
    the SiC semiconductor device has a back-side electrode structure which includes an ohmic electrode of the nickel silicide layer containing titanium carbide and a back-side electrode of the metal layer, as the electrode structure, and a Schottky electrode and a surface electrode as a surface electrode structure.

3. A method for manufacturing an SiC semiconductor device according to claim 1, wherein
the carbon layer produced in the surface of the nickel silicide layer containing titanium carbide is arranged so that the ratio of the number of carbon atoms contained in titanium carbide in the topmost surface to the total number of carbon atoms in the topmost surface is not lower than 12%.

4. A method for manufacturing an SiC semiconductor device according to claim 1, wherein
the carbon layer produced in the surface of the nickel silicide layer is made of carbon atoms precipitated in one to nine atomic layers or locally on the surface of the nickel silicide layer.

5. A method for manufacturing an SiC semiconductor device according to claim 1, wherein
the layer containing nickel and titanium is formed by sequential lamination of a nickel layer and a titanium layer on the surface of the SiC semiconductor.

6. A method for manufacturing an SiC semiconductor device according to claim 1, wherein
the reverse sputtering is argon reverse sputtering in which pressure of argon gas is not lower than 0.1 Pa and not higher than 1 Pa, and PF power is not lower than 100 W and not higher than 600 W.

7. An SiC semiconductor device manufactured by a method for manufacturing a semiconductor device according to claim 1.

* * * * *